(12) United States Patent
Takizawa et al.

(10) Patent No.: US 8,758,514 B2
(45) Date of Patent: Jun. 24, 2014

(54) CLUSTER TYPE SEMICONDUCTOR PROCESSING APPARATUS

(75) Inventors: Masahiro Takizawa, Tama (JP); Masaei Suwada, Tama (JP); Takashi Hagino, Tama (JP)

(73) Assignee: ASM Japan K.K., Tokyo (JP)

(*) Notice: Subject to any disclaimer, the term of this patent is extended or adjusted under 35 U.S.C. 154(b) by 1951 days.

(21) Appl. No.: 11/681,668

(22) Filed: Mar. 2, 2007

(65) Prior Publication Data

US 2008/0210165 A1 Sep. 4, 2008

(51) Int. Cl.
C23C 16/00 (2006.01)
H01L 21/00 (2006.01)

(52) U.S. Cl.
USPC .............................. 118/719; 414/935; 414/939

(58) Field of Classification Search
USPC ................... 118/719; 156/345.31, 345.32; 204/298.23, 298.25; 414/935, 939
See application file for complete search history.

(56) References Cited

U.S. PATENT DOCUMENTS

| | | | |
|---|---|---|---|
| 5,934,856 A * | 8/1999 | Asakawa et al. | 414/217 |
| 6,183,183 B1 | 2/2001 | Goodwin et al. | |
| 6,530,732 B1 | 3/2003 | Theriault et al. | |
| 6,609,869 B2 | 8/2003 | Aggarwal et al. | |
| 6,749,487 B2 | 6/2004 | Okuhata et al. | |
| 6,797,617 B2 | 9/2004 | Pomarede et al. | |
| 6,896,367 B1 | 5/2005 | Sohn | |
| 2005/0158153 A1 * | 7/2005 | Sundar et al. | 414/217 |
| 2008/0241384 A1 | 10/2008 | Jeong et al. | |
| 2009/0093906 A1 | 4/2009 | Takizawa et al. | |
| 2009/0252580 A1 | 10/2009 | Takizawa et al. | |
| 2010/0158644 A1 | 6/2010 | Takizawa et al. | |

FOREIGN PATENT DOCUMENTS

| | | |
|---|---|---|
| JP | 06-302667 | 10/1994 |
| JP | 08-046013 | 2/1996 |
| KR | 10-0638407 | 10/2006 |
| WO | WO 99/19777 | 4/1999 |

OTHER PUBLICATIONS

Office Action dated Sep. 3, 2010 in Chinese Patent Application No. 200810004813.2.
Office Action in Korean Patent Application No. 10-2008-001566, dated Jan. 20, 2014, filed Feb. 28, 2008.

* cited by examiner

*Primary Examiner* — Karla Moore
(74) *Attorney, Agent, or Firm* — Knobbe Martens Olson & Bear LLP

(57) ABSTRACT

A cluster type semiconductor processing apparatus includes a wafer handling chamber having a polygonal base including multiple sides for wafer processing chambers and two adjacent sides for wafer loading/unloading chambers as viewed in a direction of an axis of the wafer handling chamber. An angle A between two adjacent sides of the multiple sides for wafer processing chambers is greater than an angle B which is calculated by dividing 360° by the number of the total sides consisting of the multiple sides for wafer processing chambers and the two adjacent sides for wafer loading/unloading chambers.

13 Claims, 2 Drawing Sheets

CLUSTER TYPE SEMICONDUCTOR PROCESSING APPARATUS

BACKGROUND OF THE INVENTION

1. Field of the Invention

The present invention generally relates to a semiconductor processing apparatus, and particularly to a cluster type semiconductor processing apparatus having a relatively small footprint.

2. Description of the Related Art

The number of wafers processed per unit time on a semiconductor manufacturing apparatus (i.e., throughput) has been a major concern in semiconductor production in recent years. One way to improve this throughput is to increase the number of processing chambers attached to the semiconductor manufacturing apparatus and allow for parallel processing using these chambers, thereby increasing the number of wafers processed.

However, increasing the number of processing chambers will increase the floor area occupied by the apparatus (i.e., footprint) as long as the processing chambers are arranged horizontally on the same plane. In a limited space, this will reduce the number of apparatuses that can be installed. If the processing chambers are stacked vertically on top of each other, maintainability will decrease.

SUMMARY OF THE INVENTION

To solve the problems mentioned above, the present invention provides a semiconductor manufacturing apparatus using a semiconductor wafer transfer chamber having a special shape where, in one embodiment, the semiconductor wafer transfer chamber that normally has a regular heptagonal base is deformed to a shape that increases the angle formed by two adjacent semiconductor wafer processing chambers so that even when the number of semiconductor wafer processing chambers increases, the increase in the total width of the semiconductor manufacturing apparatus can be minimized. By increasing the angle formed by two adjacent semiconductor wafer processing chambers, the present invention also provides the secondary benefit of increasing the interval between the adjacent semiconductor wafer processing chambers and thereby improving the maintainability of these chambers.

By utilizing the aforementioned method, it becomes possible to provide a semiconductor manufacturing apparatus that minimizes the increase in the total width of the semiconductor manufacturing apparatus even when the number of semiconductor wafer processing chambers is increased by arranging more processing chambers horizontally on the same plane for the purpose of improving the throughput.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
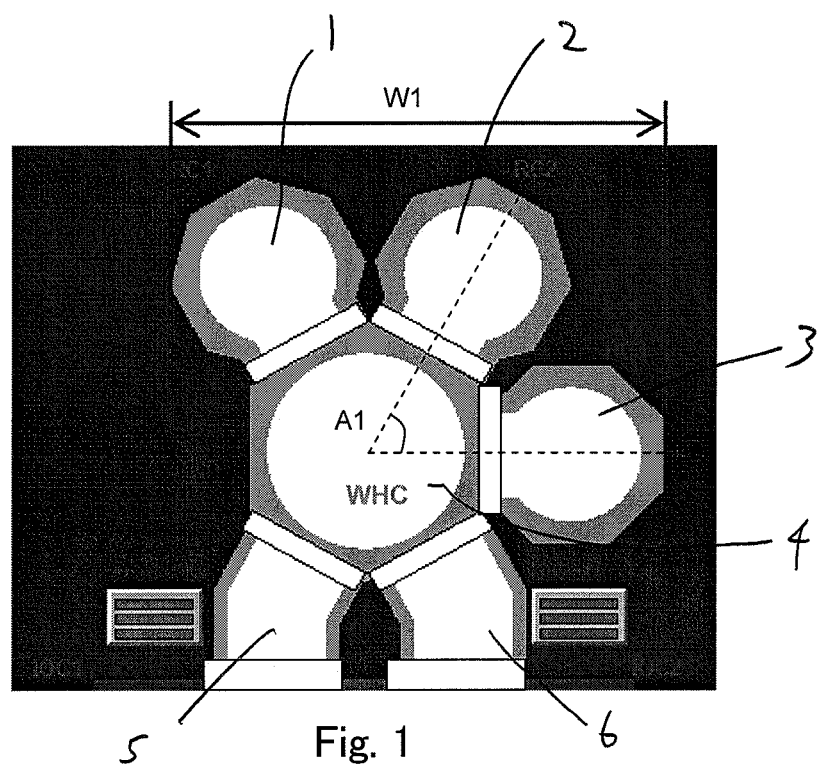
FIG. 1 is a schematic diagram of a conventional cluster type semiconductor processing apparatus.

The present invention will be explained with respect to preferred embodiments. However, the preferred embodiments are not intended to limit the present invention.

In an embodiment, the present invention provides a cluster type semiconductor processing apparatus comprising: a wafer handling chamber having a polygonal base including multiple sides for wafer processing chambers and two adjacent sides for wafer loading/unloading chambers as viewed in a direction of an axis of the wafer handling chamber, said multiple sides optionally including a blank side for maintenance, wherein each of the multiple sides for wafer processing chambers and the two adjacent sides for wafer loading/unloading chambers is arranged perpendicular to a line passing through the axis of the wafer handling chamber and a center of each side as viewed in the axial direction of the wafer handling chamber. In an embodiment, two adjacent sides of the multiple sides for wafer processing chambers form an angle A (e.g., angle A3 in FIG. 3) measured between a line passing through the axis of the wafer handling chamber and the center of one of the two adjacent sides for wafer processing chambers and a line passing through the axis of the wafer handling chamber and the center of the other of the two adjacent sides for wafer processing chambers, wherein the angle A is greater than an angle B (e.g., angle A2 in FIG. 2) which is calculated by dividing 360° by the number of the total sides consisting of the multiple sides for wafer processing chambers and the two adjacent sides for wafer loading/unloading chambers. In an embodiment, a distance D1 (e.g., distance D1 in FIG. 3) from the axis of the wafer handling chamber to each of the two adjacent sides for wafer loading/unloading chambers is greater than a distance D2 (e.g., distance D2 in FIG. 3) from the axis of the wafer handling chamber to each of the multiple sides for wafer processing chambers.

In an embodiment, angle A may be 3% to 20% (including 5%, 10%, 15%, and values between any two numbers of the foregoing) greater than angle B. In the case where the polygonal base has seven sides, angle A may be 10% to 16% greater than angle B (e.g., A/B=1.13). In an embodiment, distance D1 may be 10% to 90% (including 20%, 40%, 60%, 80%, and value between any two numbers of the foregoing) greater than distance D2. In the case where the polygonal base has seven sides, distance D1 may be 50% to 80% greater than distance D2 (e.g., D1/D2=1.68).

In an embodiment, the two adjacent sides for wafer loading/unloading chambers form an angle C (e.g., angle A4 in FIG. 3) measured between a line passing through the axis of the wafer handling chamber and the center of one of the two adjacent sides for wafer loading/unloading chambers and a line passing through the axis of the wafer handling chamber and the center of the other of the two adjacent sides for wafer loading/unloading chambers, wherein the angle C is smaller than the angle B. In an embodiment, angle C may be 3% to 50% (including 10%, 30%, 40%, and values between any two numbers of the foregoing) smaller than angle B. In the case where the polygonal base has seven sides, angle C may be 33% to 39% smaller than angle B (e.g., C/B=0.64).

In an embodiment, the number of the total sides may be seven. In another embodiment, the number of the total sides may be five, six, eight, or more. However, when the number is small, the aforesaid modifications may not be easily accomplished or no significant advantages of such modifications may be realized. On the other hand, when the number is large, the footprint of the wafer handling chamber itself becomes large, and no significant advantages of increasing the number of wafer processing chambers may be realized.

In an embodiment, the multiple sides for wafer processing chambers may include one blank side for maintenance. For maintenance purposes, typically one blank side is provided. When the number of wafer processing chambers is large, more than one blank sides may be provided.

In an embodiment, the multiple sides for wafer processing chambers may include one blank side for maintenance which is located opposite the two adjacent sides for wafer loading/unloading chambers with reference to the axis of the wafer handling chamber.

In an embodiment, a distance W (e.g., distance W4 in FIG. 3) between an edge of the side for a wafer processing chamber next to one of the two adjacent sides for wafer loading/unloading chambers and an edge of the side for a wafer processing chamber next to the other of the two adjacent sides for wafer loading/unloading chambers may be substantially or nearly the same as a length (e.g., distance W7 in FIG. 3) of the side for a wafer processing chamber located opposite the two adjacent sides for wafer loading/unloading chambers with reference to the axis of the wafer handling chamber. In an embodiment, the distance W may be greater than a length (e.g., distance W5 in FIG. 3) of each side for a wafer processing chamber except for the side located opposite the two adjacent sides for wafer loading/unloading chambers. In an embodiment, the side for a wafer processing chamber located opposite the two adjacent sides for wafer loading/unloading chambers may be a blank side for maintenance.

In an embodiment, the cluster type semiconductor processing apparatus may further comprise wafer processing chambers connected to the respective sides for wafer processing chambers except for one blank side for maintenance. In an embodiment, the cluster type semiconductor processing apparatus may further comprise wafer loading/unloading chambers connected to the respective sides for wafer loading/unloading chambers.

In an embodiment, the blank side for maintenance may be located opposite the two adjacent sides for wafer loading/unloading chambers, wherein outermost portions of the wafer processing chambers disposed between the blank side and the two adjacent sides for wafer loading/unloading chambers are aligned in a line (e.g., line a or b in FIG. 3) as viewed in the axial direction of the wafer handling chamber, said line being parallel to a line passing through the axis of the wafer handling chamber and between the two adjacent sides for wafer loading/unloading chambers. When the outermost points of the two wafer processing chambers are aligned, the width (e.g., width W3 in FIG. 3) of the cluster type semiconductor processing apparatus can be smaller than the width (e.g., width W2 in FIG. 2) when the base is polygonal.

In an embodiment, at least one of the wafer processing chambers may be a plasma CVD reactor. In an embodiment, the wafer loading/unloading chambers may be load lock chambers.

Embodiments of the present invention are explained below in details by using the figures. It should be noted, however, that the present invention is not limited to these figures and embodiments.

FIG. 1 is a schematic diagram showing one example of a conventional semiconductor manufacturing apparatus. This apparatus comprises a number of separate chambers (modules) explained below. Specifically, a wafer transfer chamber 4 is a WHC (Wafer Handling Chamber), and this wafer transfer chamber 4 has the shape of a regular hexagon, where IOC1 and IOC2 (IOC stands for "In-Out Chamber") which are wafer input/output chambers 5, 6 are disposed along two sides of the wafer transfer chamber 4 while RC1, RC2 and RC3 (RC stands for "Reactor Chamber") which are wafer processing chambers 1, 2, 3 are disposed along three of the remaining sides of the wafer transfer chamber 4. One side of this regular hexagon remains blank for maintenance reasons. In FIG. 1, theoretically four wafer processing chambers can be installed on the wafer transfer chamber. In reality, however, installing four wafer processing chambers will decrease maintainability significantly (for example, when changing robots). Accordingly, one side of the wafer transfer chamber remains blank and the number of wafer processing chambers is kept to three.

Here, the only way to increase the throughput (number of wafers processed per unit time) of the semiconductor manufacturing apparatus shown in FIG. 1, by increasing the number of wafer processing chambers without reducing maintainability, is to change the shape of the wafer transfer chamber. Following a simple logic, since the wafer transfer chamber in FIG. 1 has the shape of a regular hexagon, one more wafer processing chamber can be added if the shape is changed to a regular heptagon. This is implemented in FIG. 2. In this figure, a wafer processing chamber 7 has been added.

Figure 2:
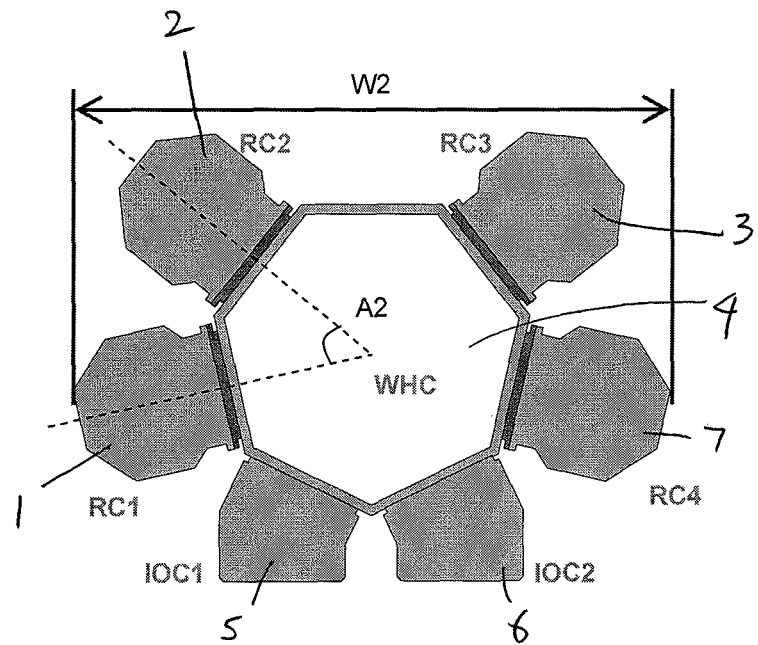
FIG. 2 is a schematic diagram of a cluster type semiconductor processing apparatus as a comparative example.

One problem here, however, is that the width of the apparatus will increase by installing four wafer processing chambers. The apparatus width W2 in the configuration shown in FIG. 2 is approx. 28% more than the apparatus width W1 in the configuration shown in FIG. 1. Here, the "apparatus width" represents the maximum distance between the outermost ends of the wafer processing chambers as measured vertically to the wafer loading/unloading directions to/from the wafer input/output chambers as seen from the axial direction of the wafer transfer chamber, or the term also represents the maximum distance between the outermost ends of the wafer processing chambers as measured vertically to the line passing the centers of the wafer input/output chambers and wafer transfer chamber.

According to this shape, although there is one blank side between the wafer processing chambers 2 and 3, the blank space between the wafer processing chambers 1 and 2 is small and so is the blank space between the wafer processing chambers 3 and 4. As a result, maintainability is reduced. With the wafer transfer chamber of a regular hexagon shape illustrated in FIG. 1, the angle A1 formed by two adjacent wafer processing chambers is calculated as 60° (360/6). However, the angle A2 formed by two adjacent wafer processing chambers used with the wafer transfer chamber of a regular heptagon shape as illustrated in FIG. 2 is 51.4° (360/7). Because the angle is smaller, the opening is also smaller and consequently operability is reduced.

Figure 3:
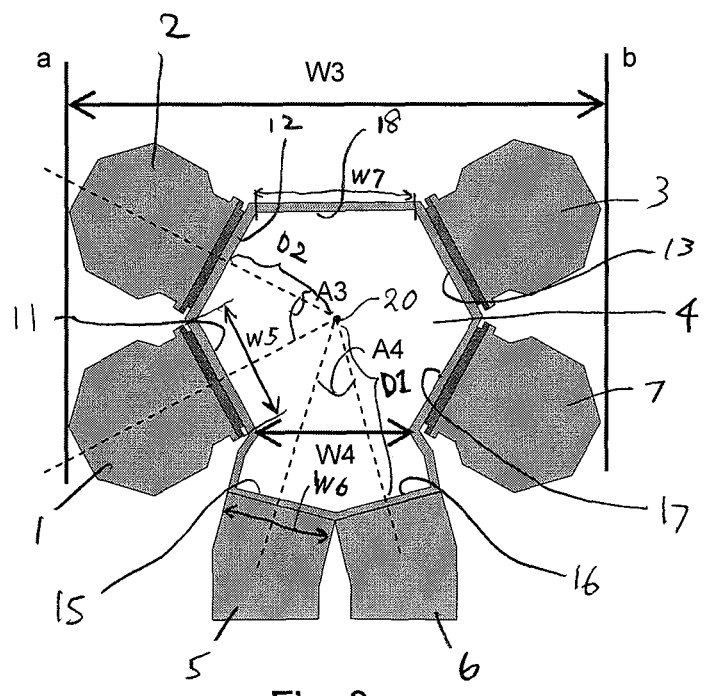
FIG. 3 is a schematic diagram of a cluster type semiconductor processing apparatus according to an embodiment of the present invention.

To address these problems, in one embodiment of the present invention the shape shown in FIG. 3 is used to decrease the apparatus width without changing the number of wafer processing chambers. Shown here is one example of an apparatus that has a wafer input/output chamber along each of the two adjoining sides along the outer periphery of the polygonal wafer transfer chamber as viewed from the axial direction of the apparatus, while a wafer processing chamber is installed along at least each of the remaining multiple sides, where the angle formed by two adjacent processing chambers, except for chambers having a blank side in between, is kept constant.

In other words, there are seven sides as with the regular heptagon configuration shown in FIG. 2, where the seven sides include a side 11 along which the wafer processing chamber 1 is disposed, a side 12 along which the wafer processing chamber 2 is disposed, a side 13 along which the wafer processing chamber 3 is disposed, a side 17 along which the wafer processing chamber 7 is disposed, a blank side 18, and sides 15, 16 along which the wafer input/output chambers 5, 6 are disposed. In FIG. 3, the angle formed by two adjacent wafer processing chambers (the angle sandwiched by the lines (shown as dotted lines in the figure) extending from a center 20 of the wafer transfer chamber 4 to the centers of adjacent wafer processing chambers, respectively, where such lines cross at right angles with the sides along which the applicable wafer processing chambers are installed) has been increased and the wafer processing chambers, especially the wafer processing chambers 1, 7, are pushed into the wafer transfer chamber. Here, the maximum distance by which the wafer processing chambers 1, 7 can be pushed in is determined by the width W4 in FIG. 3. This width W4 is determined by considering the wafer diameter, and in one embodiment it represents the minimum width that allows wafers to be transferred from the wafer input/output chambers 5, 6 to the wafer transfer chamber.

In addition, in an arrangement where the tips of the wafer processing chambers 1, 2 and tips of the wafer processing chambers 3, 7 respectively contact straight lines running parallel with the apparatus, as shown by the straight lines a, b in FIG. 3, then the angle A3 between the wafer processing chambers 1 and 2, or between the wafer processing chambers 3 and 7, becomes 58°, which is greater by 6° or more than the angle A2 (360/7=51.4°) formed by two adjacent processing chambers installed on the transfer chamber of a regular heptagon shape as illustrated in FIG. 2. Here, the greater angle between two adjacent wafer processing chambers means a greater interval between these wafer processing chambers, which is advantageous in terms of maintainability.

The apparatus width W3 in the configuration shown in FIG. 3 is approx. 17% more than the apparatus width W1 in the configuration shown in FIG. 1. In other words, the apparatus width is approx. 10% less than when the wafer transfer chamber of a regular heptagon shape as illustrated in FIG. 2 is used.

In FIG. 3, the width W6 of the wafer input/output chambers 5, 6 is also smaller than the corresponding width in the conventional regular heptagon configuration (FIG. 2). The angle A4 (defined in the same manner as with A3) formed by the wafer input/output chambers 5, 6 is 33.0°, which is smaller than A2 in FIG. 2. The smaller the angle of A4, the easier it becomes to set a shape where the wafer processing chambers 1, 7 can be pushed more inward, resulting in a reduction of the width W3. This reduced width serves to increase the interval between the wafer input/output chambers 5, 6 and wafer processing chambers 1, 7, which consequently increases maintainability.

As for the position of the blank side, providing the wafer processing chamber 1 between the wafer processing chambers 2 and 3 might present a problem regarding the maintainability of processing chambers. As long as this problem is removed, however, it is possible to provide the wafer processing chamber 1 between the wafer processing chambers 2 and 3, which will contribute to a further reduction of the apparatus width.

In FIG. 3, the wafer processing chambers 1, 2 and wafer processing chambers 3, 7 are linearly symmetrical to each other with respect to a center line passing between each pair of processing chambers, respectively, and the angles formed by the two pairs of processing chambers are also the same. This is because the width becomes minimum when both the end of the wafer processing chamber 1 and end of the wafer processing chamber 2 (or the end of the wafer processing chamber 3 and end of the wafer processing chamber 7) pass a line (straight line a in FIG. 3) crossing at right angles with the center line, i.e., the ends become the ends of the apparatus. In this case, the length W5 is the same for each side along which each wafer processing chamber is installed, and the angle is also the same for each pair of adjacent wafer processing chambers. Accordingly, the length W7 of the blank side 18 and the length W4 in FIG. 3 become the same. Here, W7 is longer than W5.

From the above, the semiconductor manufacturing apparatus proposed by the present invention, designed to minimize the increase in the apparatus width even when the number of installed wafer processing chambers is increased, improves the throughput by permitting parallel processing using an increased number of wafer processing chambers and thereby allows for installation of a multiple number of the apparatus in a limited space without reducing maintainability.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A cluster type semiconductor processing apparatus comprising:

a wafer handling chamber having a polygonal base including multiple sides for wafer processing chambers and two adjacent sides for wafer loading/unloading chambers as viewed in a direction of an axis of the wafer handling chamber, said multiple sides optionally including a blank side for interior maintenance, wherein the number of the total sides is seven, wherein each of the multiple sides for wafer processing chambers and the two adjacent sides for wafer loading/unloading chambers is arranged perpendicular to a line passing through the axis of the wafer handling chamber and a center of each side as viewed in the axial direction of the wafer handling chamber, wherein two adjacent sides of the multiple sides for wafer processing chambers form a first angle measured between a line passing through the axis of the wafer handling chamber and the center of one of the two adjacent sides for wafer processing chambers and a line passing through the axis of the wafer handling chamber and the center of the other of the two adjacent sides for wafer processing chambers, wherein the first angle is greater than a second angle which is calculated by dividing 360° by the number of the total sides consisting of the multiple sides for wafer processing chambers and the two adjacent sides for wafer loading/unloading chambers, wherein a first axis-to-side distance from the axis of the wafer handling chamber to each of the two adjacent sides for wafer loading/unloading chambers is greater than a second axis-to-side distance from the axis of the wafer handling chamber to each of the multiple sides for wafer processing chambers, wherein an edge-to-edge distance which is a distance between an edge of the side for a wafer processing chamber next to one of the two adjacent sides for wafer loading/unloading chambers and an edge of the side for a wafer processing chamber next to the other of the two adjacent sides for wafer loading/unloading chambers is substantially the same as a length of the side for a wafer processing chamber located opposite the two adjacent sides for wafer loading/unloading chambers with reference to the axis of the wafer handling chamber, said edge-to-edge distance being greater than a length of each side for a wafer processing chamber except for the side located opposite the two adjacent sides for wafer loading/unloading chambers.

2. The cluster type semiconductor processing apparatus according to claim 1, wherein the side for a wafer processing chamber located opposite the two adjacent sides for wafer loading/unloading chambers is a blank side for interior maintenance.

3. The cluster type semiconductor processing apparatus according to claim 1, further comprising wafer processing chambers connected to the respective sides for wafer processing chambers except for one blank side for interior maintenance.

4. The cluster type semiconductor processing apparatus according to claim 1, further comprising wafer loading/unloading chambers connected to the respective sides for wafer loading/unloading chambers.

5. The cluster type semiconductor processing apparatus according to claim 4, wherein the wafer loading/unloading chambers are load lock chambers.

6. The cluster type semiconductor processing apparatus according to claim 1, wherein the two adjacent sides for wafer loading/unloading chambers form a third angle measured between a line passing through the axis of the wafer handling chamber and the center of one of the two adjacent sides for wafer loading/unloading chambers and a line passing through the axis of the wafer handling chamber and the center of the other of the two adjacent sides for wafer loading/unloading chambers, wherein the third angle is smaller than the second angle.

7. The cluster type semiconductor processing apparatus according to claim 1, wherein the multiple sides for wafer processing chambers include one blank side for interior maintenance.

8. The cluster type semiconductor processing apparatus according to claim 1, wherein the multiple sides include one blank side for interior maintenance which is located opposite the two adjacent sides for wafer loading/unloading chambers with reference to the axis of the wafer handling chamber.

9. The cluster type semiconductor processing apparatus according to claim 1, wherein at least one of the wafer processing chambers is a plasma CVD reactor, and the wafer loading/unloading chambers are load lock chambers.

10. A cluster type semiconductor processing apparatus comprising:

a wafer handling chamber having a polygonal base including multiple sides for wafer processing chambers and two adjacent sides for wafer loading/unloading chambers as viewed in a direction of an axis of the wafer handling chamber, said multiple sides including a blank side for interior maintenance, wherein each of the multiple sides for wafer processing chambers and the two adjacent sides for wafer loading/unloading chambers is arranged perpendicular to a line passing through the axis of the wafer handling chamber and a center of each side as viewed in the axial direction of the wafer handling chamber, two adjacent sides of the multiple sides for wafer processing chambers form a first angle measured between a line passing through the axis of the wafer handling chamber and the center of one of the two adjacent sides for wafer processing chambers and a line passing through the axis of the wafer handling chamber and the center of the other of the two adjacent sides for wafer processing chambers, wherein the first angle is greater than a second angle which is calculated by dividing 360° by the number of the total sides consisting of the multiple sides for wafer processing chambers and the two adjacent sides for wafer loading/unloading chambers, a first distance from the axis of the wafer handling chamber to each of the two adjacent sides for wafer loading/unloading chambers is greater than a second distance from the axis of the wafer handling chamber to each of the multiple sides for wafer processing chambers, wherein said cluster type semiconductor processing apparatus further comprises wafer processing chambers connected to the respective sides for wafer processing chambers except for one blank side for maintenance, wherein the blank side for maintenance is located opposite the two adjacent sides for wafer loading/unloading chambers, wherein multiple wafer processing chambers are disposed on both sides with respect to a center line passing through the axis of the wafer handling chamber and passing between the two adjacent sides for wafer loading/unloading chambers, and wherein outmost portions of the multiple wafer processing chambers on each side are aligned in a line parallel to the center line as viewed in the axial direction of the wafer handling chamber.

11. The cluster type semiconductor processing apparatus according to claim 10, wherein at least one of the wafer processing chambers is a plasma CVD reactor.

12. The cluster type semiconductor processing apparatus according to claim 10, wherein the number of the total sides is seven.

13. The cluster type semiconductor processing apparatus according to claim 12, wherein an edge-to-edge distance which is a distance between an edge of the side for a wafer processing chamber next to one of the two adjacent sides for wafer loading/unloading chambers and an edge of the side for a wafer processing chamber next to the other of the two adjacent sides for wafer loading/unloading chambers is substantially the same as a length of the side for a wafer processing chamber located opposite the two adjacent sides for wafer loading/unloading chambers with reference to the axis of the wafer handling chamber, said edge-to-edge distance being greater than a length of each side for a wafer processing chamber except for the side located opposite the two adjacent sides for wafer loading/unloading chambers.

* * * * *